(12) United States Patent
Wolf et al.

(10) Patent No.: US 11,193,870 B2
(45) Date of Patent: Dec. 7, 2021

(54) METHOD OF ESTIMATING A CONDITION PARAMETER OF A LASER DIODE WITH AN ASSOCIATED PHOTODIODE, APPARATUS FOR MONITORING THE OPERATION OF SUCH LASER DIODE AND PARTICULAR SENSOR APPARATUS

(71) Applicants: Robert Bosch GmbH, Stuttgart (DE); Koninklijke Philips N.V., Eindhoven (NL)

(72) Inventors: Robert Wolf, Dresden (DE); Soren Sofke, Tubingen (DE); Philipp Gerlach, Ulm (DE); Susanne Weidenfeld, Weilheim (DE)

(73) Assignees: Robert Bosch GmbH, Stuttgart (DE); TRUMPF PHOTONIC COMPONENTS, GMBH, Ulm (DE)

( * ) Notice: Subject to any disclaimer, the term of this patent is extended or adjusted under 35 U.S.C. 154(b) by 16 days.

(21) Appl. No.: 16/525,722

(22) Filed: Jul. 30, 2019

(65) Prior Publication Data
US 2020/0033243 A1 Jan. 30, 2020

(30) Foreign Application Priority Data
Jul. 30, 2018 (DE) .......................... 102018212689.5

(51) Int. Cl.
| | | |
|---|---|---|
| H01S 5/026 | (2006.01) | |
| H01S 5/183 | (2006.01) | |
| G01N 15/02 | (2006.01) | |
| G01N 15/14 | (2006.01) | |
| G01N 21/47 | (2006.01) | |
| H01S 5/0683 | (2006.01) | |

(52) U.S. Cl.
CPC ..... *G01N 15/0205* (2013.01); *G01N 15/1459* (2013.01); *G01N 21/47* (2013.01); *H01S 5/0264* (2013.01); *H01S 5/183* (2013.01); *H01S 5/0683* (2013.01)

(58) Field of Classification Search
CPC ..... H01S 5/0264; H01S 5/06812; H01S 5/183
See application file for complete search history.

(56) References Cited

U.S. PATENT DOCUMENTS

| | | | | |
|---|---|---|---|---|
| 5,748,661 | A | * | 5/1998 | Kiely ................... H01S 5/0264 372/50.1 |
| 9,985,414 | B1 | * | 5/2018 | Wise ................... H01S 5/06812 |
| 2019/0383717 | A1 | * | 12/2019 | Weichmann ....... G01N 15/1434 |

* cited by examiner

*Primary Examiner* — Michael Carter
(74) *Attorney, Agent, or Firm* — Maginot, Moore & Beck LLP

(57) ABSTRACT

The present invention provides a method for estimating a condition parameter of a laser diode having an associated photodiode, to an apparatus for monitoring the operation of such a laser diode, and to a particle sensor apparatus. The photodiode (PD) is operable together with the laser diode (LD), wherein it detects the light (LS) of the laser diode (LD) and converts it into an electrical current, and is thermally coupled to the laser diode (LD). The at least one condition parameter is estimated during the operation of the laser diode (LD) and the estimation is based on current measurements and/or voltage measurements at the laser diode (LD) and/or at the photodiode (PD).

11 Claims, 2 Drawing Sheets

METHOD OF ESTIMATING A CONDITION PARAMETER OF A LASER DIODE WITH AN ASSOCIATED PHOTODIODE, APPARATUS FOR MONITORING THE OPERATION OF SUCH LASER DIODE AND PARTICULAR SENSOR APPARATUS

This application claims priority to German Application No. DE 102018212689.5, filed on Jul. 30, 2018. The entire contents of the above-mentioned German patent application are incorporated herein by reference as part of the disclosure of this U.S. application.

The present invention relates to a method for estimating a condition parameter of a laser diode having an associated photodiode, to an apparatus for monitoring the operation of such a laser diode, and to a particle sensor apparatus.

Although applicable to any method for estimating a condition parameter of a laser diode having an associated photodiode, the present invention and the underlying problems will be described in view of optical particle sensor apparatuses.

PRIOR ART

DE 10 2015 207 289 A1 discloses an optical particle sensor apparatus having a VCSEL laser diode with integrated photodiode. A VCSEL laser diode (VCSEL=vertical-cavity surface-emitting laser) is a light-emitting diode in which the light is emitted perpendicularly to the plane of the semiconductor chip. Using the self-mixing-interference technique, the known optical particle sensor apparatus makes it possible to obtain information relating to a presence of particles and the velocity thereof.

The optical particle sensor apparatus should be operated with a defined optical output power that should not only be as great as possible for a high level of measurement sensitivity of the sensor, but must also be limited for reasons of eye safety.

However, during the operation of the laser diode, the optical output power changes in dependence on the instantaneous temperature of the laser diode at the time point of the operation and on the aging condition of the laser diode in accordance with the life span degradation.

For example, adjustment or control of the set operating current of the laser diode during operation is thus necessary. In principle, this could be accomplished by way of a direct measurement of the optical output power, but in numerous miniaturized applications, in particular the aforementioned optical particle sensor apparatus, this is not possible.

In particular, it would be desirable to receive information relating to the laser diode temperature and the aging condition of the laser diode.

DISCLOSURE OF THE INVENTION

The present invention provides a method for estimating a condition parameter of a laser diode having an associated photodiode, an apparatus for monitoring the operation of such a laser diode, and a particle sensor apparatus.

Advantages of the Invention

The idea on which the present invention is based is that estimating a condition parameter of the laser diode is effected during the operation of the laser diode and is based on current measurements and/or voltage measurements at the laser diode and/or at the photodiode.

Advantageously, aging, production fluctuations, and temperature dependence of the laser diode and the associated photodiode can in this way be taken into account by way of corresponding electrical measurements at the laser diode and at the photodiode, without making a direct optical measurement or further sensors necessary.

According to a preferred embodiment, the laser diode having the associated photodiode is a laser diode having an integrated photodiode, in particular a VCSEL having an integrated photodiode. Such an arrangement is particularly compact.

According to a further preferred embodiment, the laser diode temperature TLD is estimated as a condition parameter of the laser diode by way of determining the slope PDSlope of the photodiode characteristic at the laser diode temperature TLD to be determined for at least two different values of the laser diode current ILD using measurements of the photodiode current IPD, and by basing the estimation of the laser diode temperature TLD on a previously determined relationship between the slope PDSlope of the photodiode characteristic and the laser diode temperature TLD. In this way, the laser diode temperature TLD can be determined by simple current measurements at the photodiode during runtime. In contrast, the relationship between the slope PDSlope of the photodiode characteristic and the laser diode temperature TLD is determined in advance, for example at the end of the production process of the laser diode-photodiode unit, specifically by part-individual current and voltage measurements.

According to a further preferred embodiment, the laser diode temperature TLD is estimated as a condition parameter of the laser diode by way of capturing the laser diode voltage ULD for at least one specified laser diode current ILDV at the laser diode temperature TLD that is to be estimated, wherein the estimation of the laser diode temperature TLD is based on a previously determined relationship between the predetermined laser diode current ILDV, the laser diode voltage ULD, and the laser diode temperature TLD. In this way, the laser diode temperature TLD can be determined by simple voltage measurements at the laser diode during runtime. The relationship between the predetermined laser diode current ILDV, the laser diode voltage ULD, and the laser diode temperature TLD is also determined in advance by part-individual current and voltage measurements, for example at the end of the production process of the laser diode-photodiode unit.

According to a further preferred embodiment, the laser diode temperature TLD is estimated as $$TLD = a + (b - ULD(ILDV)) * d$$

wherein a, b and d are previously determined constants. Said constants can be determined for example as part of a product series characterization of laser diode-photodiode units. In this way, the laser diode temperature TLD can be described as a simple linear relationship.

When the total operating time t of the laser diode is known, the laser diode temperature TLD can be estimated, according to a further preferred embodiment, as $$TLD = a + (b - ULD(ILDV)) * (1 - c * \exp(-t/t0)) * d$$

wherein a, b, c and d are previously determined constants that were determined for example as part of a product series characterization of laser diode-photodiode units. t0 corresponds to a previously determined operating duration that is characteristic for the aging of the laser diode. When estimating the laser diode temperature TLD, it is thus possible to take the aging condition into account.

According to a further preferred embodiment, the total operating time t is estimated as a condition parameter of the laser diode by way of capturing the laser diode voltage ULD for at least one specified laser diode current ILDV at a known laser diode temperature TLD, and by basing the estimation of the total operating time t of the laser diode on a previously determined relationship between the laser diode current ILD, the laser diode voltage ULD, the laser diode temperature TLD, and the total operating time t of the laser diode. The relationship between the laser diode current ILD, the laser diode voltage ULD, the laser diode temperature TLD and the total operating time t of the laser diode is determined here, too, in advance by part-individual current and voltage measurements, for example at the end of the production process of the laser diode-photodiode unit.

According to a further preferred embodiment, the degradation of the laser diode is assessed on the basis of the estimated total operating time t. In this way, a simple reproducible measure of the degradation is obtained.

According to a further preferred embodiment, the total operating time t is estimated as the condition parameter of the laser diode by determining a respective instantaneous photodiode characteristic by way of measurements of the photodiode current IPD in dependence on the laser diode current ILD, ascertaining the instantaneous threshold current Ith of the laser diode from the respective instantaneous photodiode characteristic, and estimating the total operating time t of the laser diode on the basis of the respective instantaneous threshold current Ith. The threshold current likewise offers a reliable measure of the aging or total operating time of the laser diode. The threshold current of the laser diode is the current starting with which laser operation begins. This estimation is made possible because the characteristics of the laser diode and of the associated photodiode exhibit similar behavior.

According to a further preferred embodiment, the instantaneous threshold current Ith is ascertained by capturing first photodiode current values IPD1, IPD2 for at least two laser diode current values ILD1, ILD2 at which the laser diode is not yet in laser operation, by capturing second photodiode current values IPD3, IPD4 for at least two laser diode current values ILD3, ILD4 at which the laser diode is in laser operation, by in each case linearly extrapolating the first photodiode current values IPD1, IPD2 and the second photodiode current values IPD3, IPD4, and by determining the intersection of the two resulting straight lines g and h as the instantaneous threshold current Ith. Such extrapolation is easy to perform and provides reliable values.

According to a further preferred embodiment, the instantaneous threshold currents Ith1, Ith2 for at least two laser diodes are ascertained, wherein the total operating times t1, t2 of the two individual laser diodes are correlated with one another by comparing the instantaneous threshold currents Ith1, Ith2 that were ascertained for the two individual laser diodes. In this way it is possible to estimate the relative aging of the two laser diodes.

According to preferred embodiment of the apparatus according to the invention for monitoring the operation of at least one laser diode with an associated photodiode, the estimating device is configured such that it estimates the laser diode temperature TLD. This embodiment comprises a switch-off apparatus for automatically switching off the laser diode when the laser diode temperature TLD exceeds or falls below a specified limit value. This increases operational safety.

According to a further preferred embodiment, in which the estimating device is configured such that it estimates the laser diode temperature TLD, the apparatus according to the invention comprises a feedback control device for the photodiode voltage UPD in dependence on the estimated laser diode temperature TLD, which is in particular configured such that it keeps the sensitivity of the photodiode at a specified level. In this way, the capturing accuracy is stabilized.

According to a further preferred embodiment, in which the estimating device is configured such that it estimates the laser diode temperature TLD, the apparatus according to the invention comprises a signal processing device that is set up to modify the captured photodiode current signal in dependence on the estimated laser diode temperature TLD to compensate temperature influences. In this way, the capturing accuracy is likewise stabilized.

According to a further preferred embodiment, the estimating device is configured such that it estimates, or at least correlates, the total operating times t1, t2 of two individual laser diodes, wherein a switching apparatus for selectively operating at least one laser diode in dependence on the estimated or relativized total operating times t1, t2 of the two individual laser diodes is provided.

BRIEF DESCRIPTION OF THE DRAWINGS

In the figures.

Identical or functionally identical elements are denoted in the figures with the same reference signs.

DESCRIPTION OF THE EXEMPLARY EMBODIMENTS

Figure 1A:
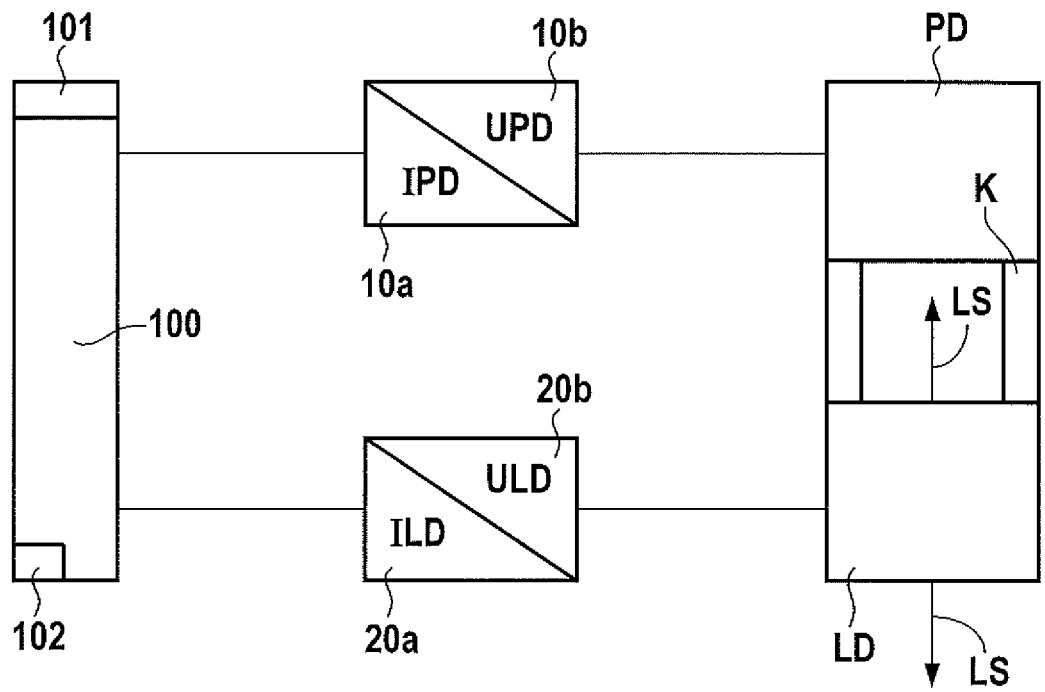
FIG. 1a) shows a block diagram for explaining a method and an apparatus for estimating a condition parameter of a laser diode having an associated photodiode according to a first embodiment of the present invention.

FIG. 1a) shows a block diagram for explaining a method and an apparatus for estimating a condition parameter of a laser diode having an associated photodiode according to a first embodiment of the present invention.

The apparatus comprises a laser diode LD and a photodiode PD that is associated with the laser diode LD such that the photodiode PD is operable together with the laser diode LD. The photodiode PD is arranged such that it can detect the light LS of the laser diode LD and convert it into an electrical current IPD. When used in an optical particle sensor apparatus, the light LS of the laser diode LD at the same time functions as the measurement beam.

In the exemplary embodiment illustrated here, the photodiode PD is thermally coupled to the laser diode LD via a coupling device K such that the photodiode PD and the laser diode LD are substantially at the same temperature during operation.

In one variant, the laser diode LD has an integrated photodiode PD, and is in particular a VCSEL (vertical-cavity surface-emitting laser) with an integrated photodiode, but the embodiment is in general not limited thereto, but rather applicable to any desired functionally and thermally coupled arrangements of at least one laser diode having at least one associated photodiode.

A voltage source 10b serves for applying a defined operating voltage UPD to the photodiode PD. This operating voltage UPD can optionally be freely selectable. A current measurement device 10a serves for capturing the photodiode current IPD. A current source 20a serves for applying a feedback-controllable current ILD to the laser diode LD, and a voltage measurement device 20 serves for capturing the output voltage ULD of the laser diode LD.

An estimating device 100, which is connected to the current measurement device 10a, the voltage source 10b, the current source 20a, and the voltage measurement device 20b and can control said components during operation, serves for estimating a condition parameter of the laser diode LD during the operation of the laser diode LD based on current measurements and/or voltage measurements at the laser diode LD and/or at the photodiode PD. In the example described, these are current measurements at the photodiode PD in the case of specifiable currents of the laser diode or voltage measurements at the laser diode LD in the case of specifiable currents of the laser diode. Alternatively, however, different current and voltage measurements are possible.

The estimating device 100 is configured such that it estimates the condition parameter, for example laser diode temperature TLD and/or total operating time t, of the laser diode LD at specifiable time points, for example in intervals, or in an event-oriented fashion at the running time of the laser diode LD and the associated photodiode PD. The estimation is effected in a dedicated estimating mode, during which the actual laser operation is interrupted. That means that, for estimating a condition parameter, it is necessary to switch from an operating mode of the laser diode LD and associated photodiode PD to an estimating mode.

Optionally, a feedback control device 102 for the photodiode voltage UPD in dependence on the estimated laser diode temperature TLD is present, which is configured in particular such that it keeps the sensitivity of the photodiode PD at a specified level.

In addition to the estimating device 100, the apparatus illustrated in FIG. 1a has, as an optional safety feature, a switch-off apparatus 101 that is set up to automatically switch off the laser diode LD when the laser diode temperature TLD exceeds or falls below a specified limit value.

Figure 1B:
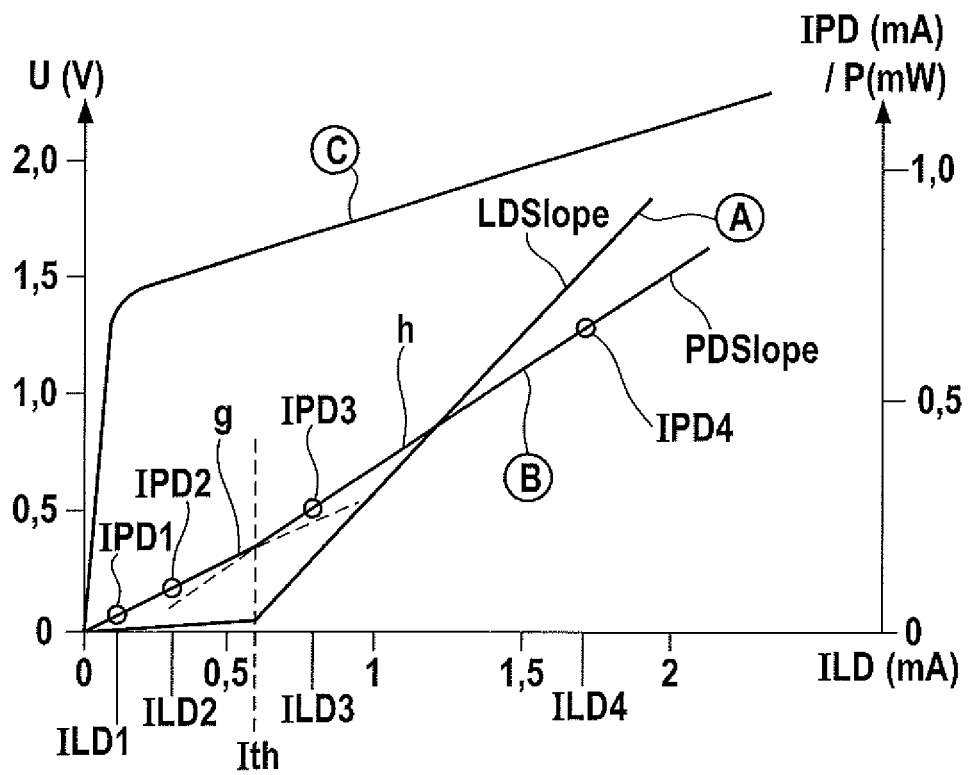
FIG. 1b) shows an illustration of the current-output power characteristic (curve A) of the laser diode and the laser current-photodiode current characteristic (curve B) of the photodiode and the current-voltage characteristic of the laser diode (curve C) for explaining the method and the apparatus for estimating a condition parameter of the laser diode having the associated photodiode according to the first embodiment of the present invention.

FIG. 1b) shows an illustration of the current-output power characteristic (curve A) of the laser diode and the laser current-photodiode current characteristic (curve B) of the photodiode and the current-voltage characteristic of the laser diode (curve C) for explaining the method and the apparatus for estimating a condition parameter of the laser diode having the associated photodiode according to the first embodiment of the present invention.

ULD here denotes the laser diode voltage in volt (V), ILD denotes the laser diode current in milliampere (mA), P denotes the output power of the laser diode in milliwatts (mW), and IPD denotes the photodiode current in milliampere (mA).

The current-output power characteristic of the laser diode LD as per curve A has, in the lower current region, only a very low slope up to a threshold current Ith, which is approximately 0.6 mA in the present example. When the threshold current Ith of the laser diode LD is exceeded, laser operation begins, and the slope of the current-output power characteristic abruptly increases significantly. The slope of the current-output power characteristic of the laser diode LD above the threshold current Ith is denoted with LDSlope in FIG. 1b.

The corresponding laser current-photodiode current characteristic of the photodiode PD with constant voltage at the photodiode PD is illustrated by curve B.

The corresponding laser current-photodiode current characteristic of the photodiode PD has a similar profile as the current-output power characteristic of the laser diode LD, at least in regard to the slope change at the threshold current Ith of the laser diode LD that occurs when laser operation begins. However, said slope change in the laser current-photodiode current characteristic of the photodiode PD is significantly smaller than the slope change in the current-output power characteristic of the laser diode LD. The slope of the laser current-photodiode current characteristic of the photodiode PD above the threshold current Ith of the laser diode LD is designated PDSlope in FIG. 1b and is lower than the corresponding slope LDSlope of the current-output power characteristic of the laser diode LD.

In has been found that the threshold current Ith of the laser diode LD can be ascertained on the basis of the slope change of the laser current photodiode current characteristic of the photodiode PD.

Consequently, electrical measurements of the laser current-photodiode current characteristic of the photodiode PD can provide information relating to the profile of the current-output power characteristic of the laser diode LD. However, to obtain more detailed information relating to the temperature dependence and the aging condition, production fluctuations of the product series must also be taken into consideration, as will be explained further below.

As is indicated in FIG. 1b), the photodiode current IPD1, IPD2, IPD3, IPD4 is determined at different predetermined currents ILD1, ILD2, ILD3, ILD4 of the laser diode LD during operation of the laser diode LD, wherein the voltage UPD at the photodiode PD is kept constant.

The current values ILD1, ILD2 in this case lie in the lower region of the current-output power characteristic of the laser diode LD, that is to say below the threshold current Ith of the laser diode LD, and the current values ILD3, ILD4 lie in the upper region of the current-output power characteristic of the laser diode LD, that is to say above the threshold current Ith of the laser diode LD.

On account of a linear extrapolation (indicated in dashes) of two straight lines g and h, extending through the measured photodiode current values IPD1, IPD2 and IPD3, IPD4, it is possible to determine the threshold current Ith of the laser diode LD and the slope PDSlope of the laser current photodiode current characteristic of the photodiode PD above the threshold current Ith of the laser diode LD.

The first embodiment of the method according to the invention for estimating the laser diode temperature TLD uses the value PDSlope, determined on the basis of the photodiode PD in predetermined time intervals or in an event-initiated fashion, and further parameters that were determined in advance and take into account the temperature dependence, the aging condition, and the production fluctuations of the product series, as will be explained in more detail below.

The laser diode temperature TLD is estimated as a condition parameter of the laser diode LD by way of determining the slope PDSlope of the photodiode characteristic (B) at the laser diode temperature TLD to be determined for at least two different values of the laser diode current ILD3, ILD4 using measurements of the photodiode current IPD, and by basing the estimation of the laser diode temperature TLD on a previously determined relationship fkt1 between the slope PDSlope of the photodiode characteristic B and the laser diode temperature TLD, that is to say TLD=$fkt1$(PDSlope)

This relationship is preferably ascertained in a trimming procedure, wherein the constants or parameters describing the functional relationship can be determined for example by way of a regression fit of a series of measurement values of samples at defined conditions.

Alternatively, the laser diode temperature TLD is estimated as a condition parameter of the laser diode LD by way of capturing the laser diode voltage ULD for the at least one specified laser diode current ILDV at the laser diode temperature TLD that is to be estimated, wherein the estimation of the laser diode temperature TLD is based on a previously determined relationship fkt2 between the predetermined laser diode current ILDV, for example 50 microampere, the laser diode voltage ULD, and the laser diode temperature TLD, that is to say TLD=$fkt2$(ULD(ILDV))

For example, the laser diode temperature TLD is estimated as

TLD=$a+(b-\text{ULD(ILDV)})*d$ wherein a, b and d are previously determined parameters or constants. As before, the parameters a, b and d can be determined as part of a trimming procedure by way of a regression fit of a series of measurement values of samples at defined conditions or by relying on a suitable model.

In another illustration, the instantaneous captured value of ULD(ILDV)−ULDT(ILDV) provides an estimated value for an instantaneous temperature TLD of the laser diode LD, which is obtained from:

TLD=TREF+κ(ULD−ULDT)

wherein κ is an empirically ascertainable temperature constant and is typically 0.7 K/mV, and ULDT(ILDV) is the diode voltage measured at the time point t0 of the start of the operation of the laser diode LD at a defined temperature TREF for the specified laser diode current ILDV.

It has been shown that the value ULD−ULDT is dependent on the aging condition of the laser diode LD, which can be presented as follows by an empirically ascertainable age factor μ:

TLD=TREF+κ(ULD−ULDT)(1−μ exp($t/t0$))

wherein t is the total operating time, and t0 is a previously determined operating duration that is characteristic of the aging of the laser diode (LD). If the total operating time t of the laser diode LD is known, for example because of corresponding measurements, the relationship that reflects the laser diode temperature TLD can also be illustrated as:

TLD=$a+(b-\text{ULD(ILDV)})*(1-c*\exp(-t/t0))*d$ wherein a, b, c and d are previously determined parameters or constants in accordance with the trimming procedure.

On the other hand, if the instantaneous temperature TLD of the laser diode LD is otherwise known, this equation can be resolved for the total operating time t and estimated by way of capturing the laser diode voltage ULD for the at least one specified laser diode current ILDV at the known laser diode temperature TLD, wherein the estimation of the total operating time t of the laser diode LD is based on a previously determined relationship fkt3 between the laser diode current ILD, the laser diode voltage ULD, the laser diode temperature TLD, and the total operating time t of the laser diode LD, that is to say t=$fkt3$(ULD(ILDV),TLD).

The degradation of the laser diode LD can be assessed based on the estimated total operating time t. On this basis, measures can be taken, for example replacement or adaptation of the feedback control of the laser diode current.

Alternatively, the total operating time t can be estimated as the condition parameter of the laser diode LD by determining a respectively instantaneous photodiode characteristic B by way of measurements of the photodiode current IPD in dependence on the laser diode current ILD, ascertaining the instantaneous threshold current Ith of the laser diode LD from the respective instantaneous photodiode characteristic B, and estimating the total operating time t of the laser diode on the basis of the respective instantaneous threshold current Ith.

In this case, the instantaneous threshold current Ith is ascertained, for example, by capturing first photodiode current values IPD1, IPD2 for at least two laser diode current values ILD1, ILD2 at which the laser diode (LD) is not yet in laser operation, by capturing second photodiode current values IPD3, IPD4 for at least two laser diode current values ILD3, ILD4 at which the laser diode (LD) is in laser operation, and by in each case linearly extrapolating the first photodiode current values IPD1, IPD2 and the second photodiode current values IPD3, IPD4, and by determining the intersection of the two resulting straight lines g and h as the instantaneous threshold current Ith.

Figure 2:
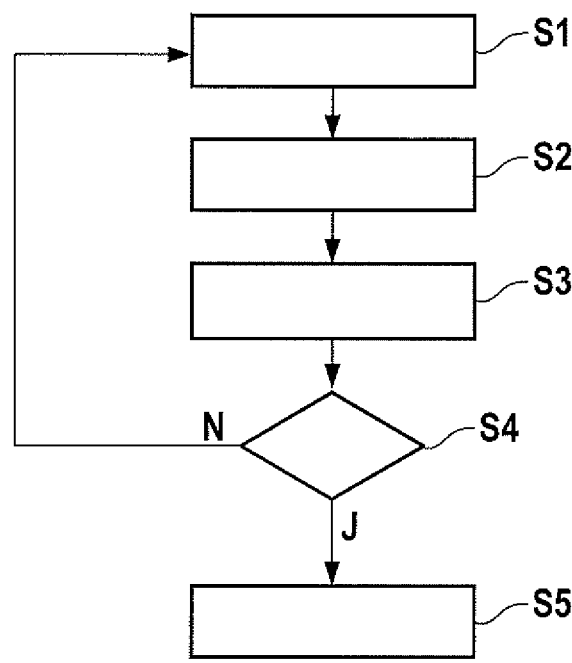
FIG. 2 shows a flowchart for explaining the method and the apparatus for estimating a condition parameter of a laser diode having an associated photodiode according to the first embodiment of the present invention.

FIG. 2 is a flowchart for explaining the method for estimating a condition parameter, here the laser diode temperature TLD=$a+(b-\text{ULD(ILDV)})*d$, of a laser diode in an arrangement with at least one laser diode and at least one photodiode according to the first embodiment of the present invention.

According to FIG. 2, the measurement variable ULD (ILDV) is defined in step S1, for example with ILDV=50 microampere.

In step S2, the parameters a, b and d are provided.

In step S3, the laser diode temperature is ascertained in accordance with the above relationship TLD=$a+(b-\text{ULD(ILDV)})*d$.

It is ascertained in step S4 whether the laser diode temperature exceeds a specified limit value.

If so, the laser diode LD is automatically switched off in step S5. If this is not the case, the method jumps back to step S1.

Figure 3:
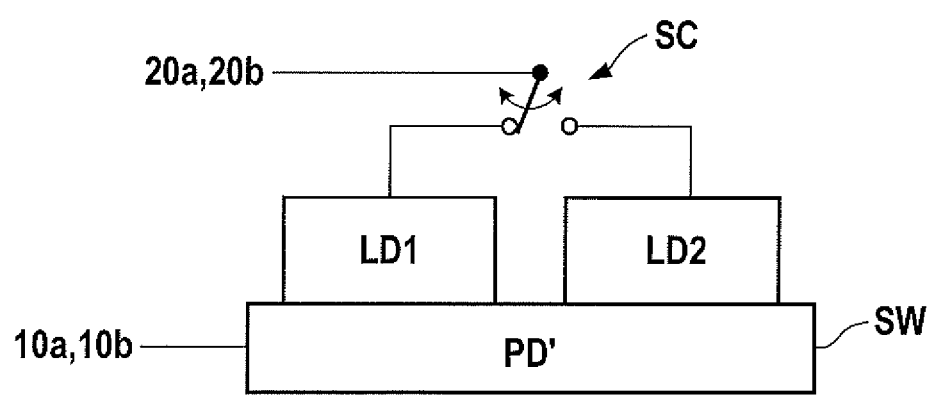
FIG. 3 shows an integrated arrangement having two laser diodes and an associated photodiode for use in a second embodiment of the present invention.

FIG. 3 shows an integrated arrangement having two laser diodes and a photodiode for use in a second embodiment of the present invention.

In the second embodiment, a first laser diode LD1 and a second laser diode LD2 and also a photodiode PD' are integrated in a common substrate SU, in particular in the form of a VCSEL laser diode with integrated photodiode, wherein light is emitted perpendicularly to the plane of the substrate SU.

The condition parameter, here the laser diode temperature, is estimated as described in the first embodiment.

For the alternating estimation of the condition parameter of the first laser diode LD1 and the second laser diode LD2, a switching device SC is provided for connecting to the current measurement device 10a and the voltage source 10b.

In the second embodiment, the instantaneous threshold currents Ith1, Ith2 for at least two laser diodes LD1, LD2 are ascertained, wherein the total operating times t1, t2 of the two individual laser diodes LD1, LD2 are correlated with one another by comparing the instantaneous threshold currents Ith1, Ith2 that were ascertained for the two individual laser diodes LD1, LD2. Since the threshold currents Ith1, Ith2 increase with increasing age, it is possible to draw a qualitative conclusion relating to the condition of the laser diodes LD1, LD2 by comparing the threshold currents Ith1, Ith2.

The switching apparatus SC makes possible selective operation of at least one of the laser diodes LD1, LD2 in dependence on the estimated or relativized total operating times t1, t2 of the two individual laser diodes LD1, LD2.

Although the present invention was described above with reference to preferred exemplary embodiments, it is not limited thereto, but is modifiable in a variety of ways.

Although the functional dependence in the case of the above embodiments is empirically ascertained in a trimming procedure, this could also be accomplished by way of a theoretical model.

Likewise, the result of the estimation of the condition parameter can be used as desired for internal and/or external technical measures in the system.

The apparatus can be equipped for example with a feedback control device for the photodiode voltage in dependence on the estimated laser diode temperature, which is configured in particular such that it keeps the sensitivity of the photodiode at a specified level.

Furthermore, a signal processing device can be present, which is set up to modify the captured photodiode current signal in dependence on the estimated laser diode temperature to compensate temperature influences.

Monitoring can be effected with any desired number of laser diodes and any desired number of associated photodiodes.

The invention claimed is:

1. A method for estimating at least one condition parameter of at least one laser diode, wherein at least one photodiode is associated with the laser diode
   which is operable together with the laser diode,
   which detects the light of the laser diode and converts it into an electrical current IPD, and
   which is thermally coupled to the laser diode,
   wherein the at least one condition parameter includes a total cumulative operating time t of the laser diode and is estimated during the operation of the laser diode, wherein the estimation is based on current measurements and/or voltage measurements at the laser diode and/or at the photodiode.

2. The method as claimed in claim 1, wherein the laser diode having the associated photodiode is a laser diode having an integrated photodiode in particular a VCSEL (vertical-cavity surface-emitting laser) having an integrated photodiode.

3. The method as claimed in claim 1, wherein a laser diode temperature TLD of the laser diode is estimated as an additional one of the at least one condition parameter of the laser diode by way of
   determining the slope PDSlope of the photodiode characteristic at the laser diode temperature TLD to be determined for at least two different values of the laser diode current ILD using measurements of the photodiode current IPD, and
   by basing the estimation of the laser diode temperature TLD on a previously determined relationship between the slope PDSlope of the photodiode characteristic and the laser diode temperature TLD.

4. The method as claimed in claim 1, wherein a laser diode temperature TLD of the laser diode is estimated as an additional one of the least one condition parameter of the laser diode by way of
   capturing the laser diode voltage ULD for at least one specified laser diode current ILDV at the laser diode temperature TLD that is to be estimated, and
   basing the estimation of the laser diode temperature TLD on a previously determined relationship between the predetermined laser diode current ILDV, the laser diode voltage ULD, and the laser diode temperature TLD.

5. The method as claimed in claim 4, wherein the laser diode temperature TLD is estimated as $$TLD=a+(b-ULD(ILDV))*d$$

wherein a, b and d are previously determined constants.

6. The method as claimed in claim 4, wherein the total cumulative operating time t of the laser diode is known, and the laser diode temperature TLD is estimated as $$TLD=a+(b-ULD(ILDV))*(1-c*\exp(-t/t0))*d$$

wherein a, b, c and d are previously determined constants, and t0 is a previously determined operating duration that is characteristic of the aging of the laser diode.

7. The method as claimed in claim 1, wherein the total cumulative operating time t is estimated as the condition parameter of the laser diode by way of
   capturing the laser diode voltage ULD for at least one specified laser diode current ILDV at a known laser diode temperature TLD, and
   basing the estimation of the total cumulative operating time t of the laser diode on a previously determined relationship between the laser diode current ILD, the laser diode voltage ULD, the laser diode temperature TLD, and the total cumulative operating time t of the laser diode.

8. The method as claimed in claim 7, wherein the degradation of the laser diode is assessed on the basis of the estimated total cumulative operating time t.

9. The method as claimed in claim 1, wherein the a total cumulative operating time t is estimated as the condition parameter of the laser diode by way of
   determining a respective instantaneous photodiode characteristic by way of measurements of the photodiode current IPD in dependence on the laser diode current ILD,
   ascertaining the instantaneous threshold current Ith of the laser diode from the respective instantaneous photodiode characteristic and
   estimating the total cumulative operating time t of the laser diode on the basis of the respective instantaneous threshold current Ith.

10. The method as claimed in claim 9, wherein the instantaneous threshold current Ith is ascertained
    by capturing first photodiode current values IPD1, IPD2 for at least two laser diode current values ILD1, ILD2 at which the laser diode is not yet in laser operation,
    by capturing second photodiode current values IPD3, IPD4 for at least two laser diode current values ILD3, ILD4 at which the laser diode is in laser operation, by in each case linearly extrapolating the first photodiode current values IPD1, IPD2 and the second photodiode current values IPD3, IPD4, and by determining the intersection of the two resulting straight lines g and h as the instantaneous threshold current Ith.

11. The method as claimed in claim 9, wherein the instantaneous threshold currents Ith1, Ith2 for at least two laser diodes are ascertained, and wherein the total cumulative operating times t1, t2 of the two individual laser diodes are correlated with one another by comparing the instantaneous threshold currents Ith1, Ith2 that were ascertained for the two individual laser diodes.

* * * * *